(12) United States Patent
Erb et al.

(10) Patent No.: US 6,500,754 B1
(45) Date of Patent: Dec. 31, 2002

(54) ANNEAL HILLOCK SUPPRESSION METHOD IN INTEGRATED CIRCUIT INTERCONNECTS

(75) Inventors: Darrell M. Erb, Los Altos, CA (US); Steven C. Avanzino, Cupertino, CA (US); Alline F. Myers, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/999,661

(22) Filed: Oct. 31, 2001

Related U.S. Application Data
(60) Provisional application No. 60/245,690, filed on Nov. 2, 2000.

(51) Int. Cl.[7] .......................................... H01L 21/4763
(52) U.S. Cl. ...................... 438/626; 438/627; 438/633; 438/660
(58) Field of Search .................................. 438/660, 687, 438/650, 672, 675, 626, 633, 627

(56) References Cited

U.S. PATENT DOCUMENTS

| | | | | |
|---|---|---|---|---|
| 5,447,887 A | * | 9/1995 | Filipiak et al. | 437/200 |
| 6,174,810 B1 | * | 1/2001 | Islam et al. | 438/687 |
| 6,225,217 B1 | * | 5/2001 | Usami et al. | 438/637 |
| 6,340,410 B1 | | 2/2002 | Ngo et al. | 438/660 |

* cited by examiner

*Primary Examiner*—John F. Niebling
*Assistant Examiner*—Lynne Gurley
(74) *Attorney, Agent, or Firm*—Mikio Ishimaru

(57) ABSTRACT

An integrated circuit and manufacturing method therefore is provided having a semiconductor substrate with a semiconductor device. A device dielectric layer is formed on the semiconductor substrate, and a channel dielectric layer formed on the device dielectric layer has an opening formed therein. A barrier layer lines the channel opening and a conductor core fills the opening over the barrier layer. Before planarization of the conductor core and the barrier layer, an anneal of the semiconductor substrate is performed at high temperatures of 400° C. and above to stimulate grain growth. After planarization, subsequent high temperature deposition of passivating or capping layers will not cause grain growth and hillocks will be suppressed.

10 Claims, 3 Drawing Sheets

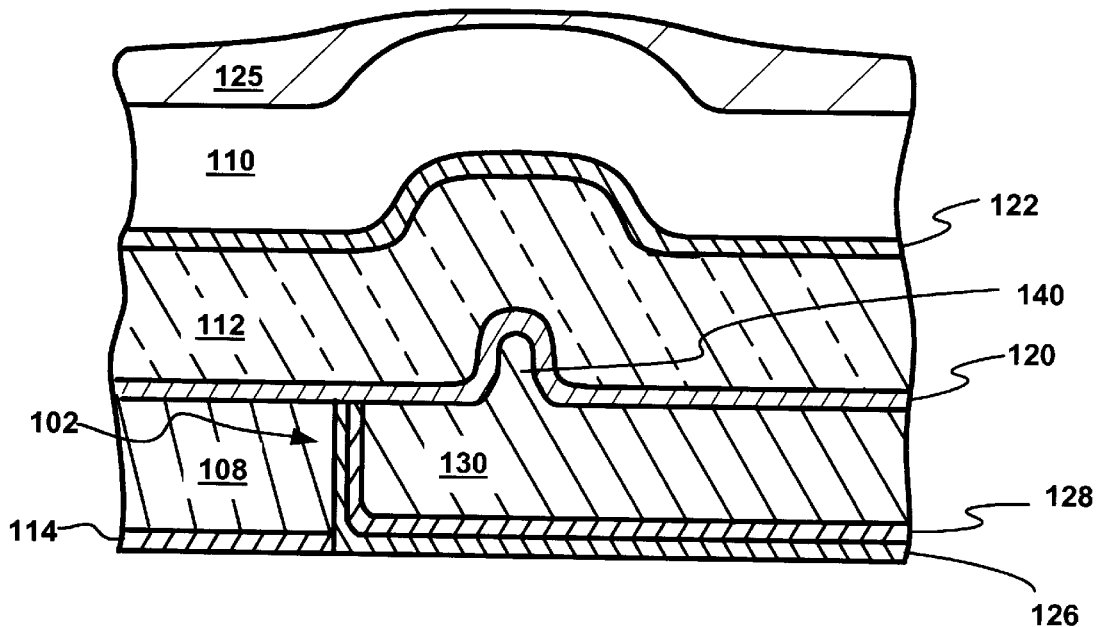
FIG. 2.1 (PRIOR ART)
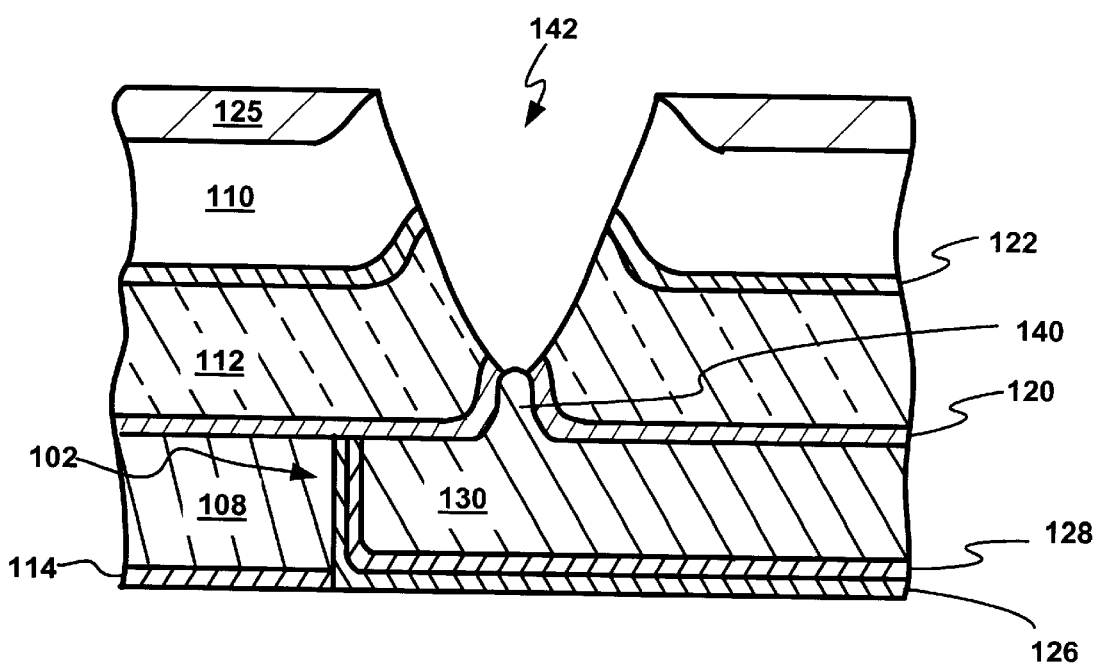
FIG. 2.2 (PRIOR ART)

ANNEAL HILLOCK SUPPRESSION METHOD IN INTEGRATED CIRCUIT INTERCONNECTS

CROSS-REFERENCE TO RELATED APPLICATION(S)

This application claims the benefit of U.S. Provisional patent application Ser. No. 60/245,690 filed Nov. 2, 2000, which is hereby incorporated by reference thereto.

The present application also contains subject matter related to U.S. patent application Ser. No. 09/705,396, now U.S. Pat. No. 6,348,410, by Minh Van Ngo, Dawn M. Hopper, and Robert A. Huertas entitled "LOW TEMPERATURE HILLOCK SUPPRESSION METHOD IN INTEGRATED CIRCUIT INTERCONNECTS".

TECHNICAL FIELD

The present invention relates generally to semiconductor technology and more specifically to suppressing hillocks in copper interconnects in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings. The seed layer, generally of copper, is deposited to act as an electrode for the electroplating process.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and the "single" damascene process is completed. When additional layers of material are to be deposited for the dual damascene process, the capping layer also functions as an etch stop layer for a via formation step.

The via formation step of the dual damascene process continues with the deposition of a via dielectric layer over the first channels, the first channel dielectric layer, and the capping or via stop layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, which are deposited by electroplating, a seed layer is deposited by electro-less deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to simultaneously form the vias and the second channels. When a layer is placed over the second channels as a final layer, it is called a "capping" layer and the "dual" damascene process is completed.

Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

One major problem relates to the formation of hillocks in the copper surface, which are due to grain growth at elevated temperatures. A hillock is a protrusion of copper from the copper surface. Hillocks tend to form most readily at free surfaces where there are no constraining films, but they can also protrude through thin films if the stresses are high enough. If the hillocks are large enough, they can result in causing short circuit types of defects either immediately or over time, which irrevocably damage the integrated circuit.

Solutions to this problem have been long sought but have long eluded those skilled in the art.

DISCLOSURE OF THE INVENTION

The present invention provides a method for manufacturing an integrated circuit having a semiconductor substrate with a semiconductor device. A dielectric layer is formed on the semiconductor substrate and an opening is formed in the dielectric. A barrier layer is deposited to line the opening, and a conductor core is deposited to fill the channel opening over the barrier layer. A high temperature anneal is performed above about 400° C. to force grain growth in the conductor core material and relieve stress in the copper. The conductor core and barrier are planarized. A capping layer is deposited at a high temperature of 400° C. The high temperature anneal removes the driving force for grain growth during passivation and suppresses the formation of hillocks.

The above and additional advantages of the present invention will become apparent to those skilled in the art from a reading of the following detailed description when taken in conjunction with the accompanying drawings.

BRIEF DESCRIPTION OF THE DRAWINGS

FIG. 2.1 (PRIOR ART) is a close-up cross-section of a hillock during an intermediate stage of processing;

FIG. 2.2 (PRIOR ART) is a close-up cross-section of a hillock in a subsequent stage of processing.

BEST MODE FOR CARRYING OUT THE INVENTION

Figure 1:
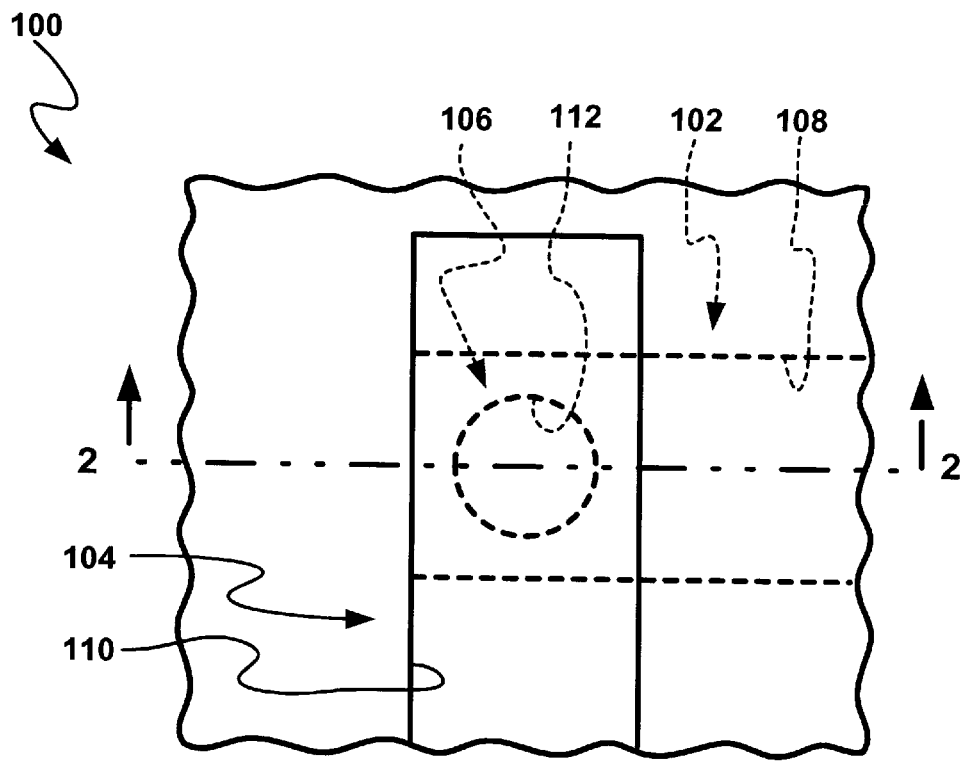
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
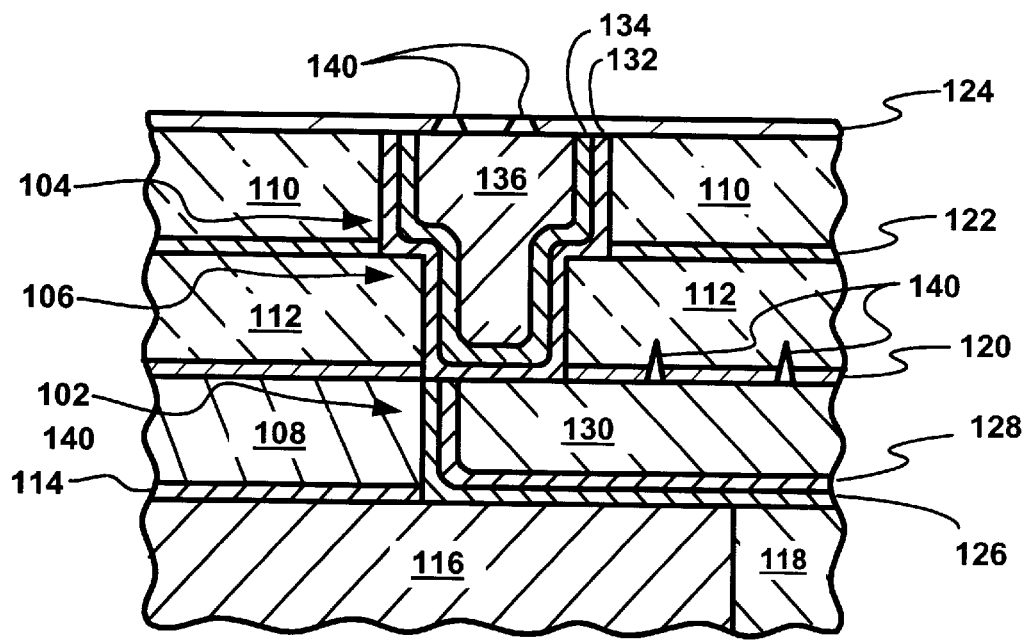
FIG. 2 (PRIOR ART) is a cross-section of FIG. 1 (PRIOR ART) along line 2—2 showing hillocks.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a capping layer 120, the via dielectric layer 112, a second channel stop layer 122, the second channel dielectric layer 110, and a next capping layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device.

The seed layers 128 and 134 form electrodes on which the conductor material of the conductor cores 130 and 136 are deposited. The seed layers 128 and 134 are of substantially the same conductor material as the conductor cores 130 and 136 and become part of the respective conductor cores 130 and 136 after the deposition.

In the past with copper conductor materials, before the respective capping layers 120 and 124 are formed, the semiconductor wafer is first subject to a low temperature anneal below 300° C. to reduce any residual stresses which may be present in the electroplated copper on the semiconductor wafer 100. This is followed by chemical-mechanical polishing (CMP) to remove the respective conductor cores 130 and 136 and the respective barrier layers 126 and 132 above their respective dielectric layers 108 and 110. Finally, the semiconductor wafer 100 is heated to 400° C. and passivating layers of silicon nitride are deposited to provide the capping layers 120 and 124, which may be up to 500 Å in thickness.

It has been discovered that the heating above 400° C. after CMP and before passivation often results in the formation of hillocks 140 in the exposed conductor material 130 and 136. The hillocks 140 can, in some instances, be large enough to cause short circuits in the final structure.

Referring now to FIG. 2.1 (PRIOR ART), a hillock 140 is shown in the conductor core 130. After the passivation or capping layer 120 is deposited, the via dielectric layer 112 and the second channel stop layer 122 are deposited. In this example, the layers are deposited by chemical vapor deposition (CVD), and they tend to conform to the hillock surface. Next, a layer of photoresist 125 is deposited using a spin-on process, which tends to planarize the top surface of the photoresist 125, and the hillock 140 produces a region of thin or no photoresist 125.

Referring now to FIG. 2.2, in subsequent processing involving etching, the photoresist 125 is supposed to prevent etching of the layers beneath it. However, the photoresist 125 is so thin that it ceases to act as a mask, and etching of the layers beneath it will occur to create the opening 142. Where the next conductor core is not intended to contact the conductor core 130, the deposition of the conductor core will fill the opening 142 creating a short circuit.

Figure 3:
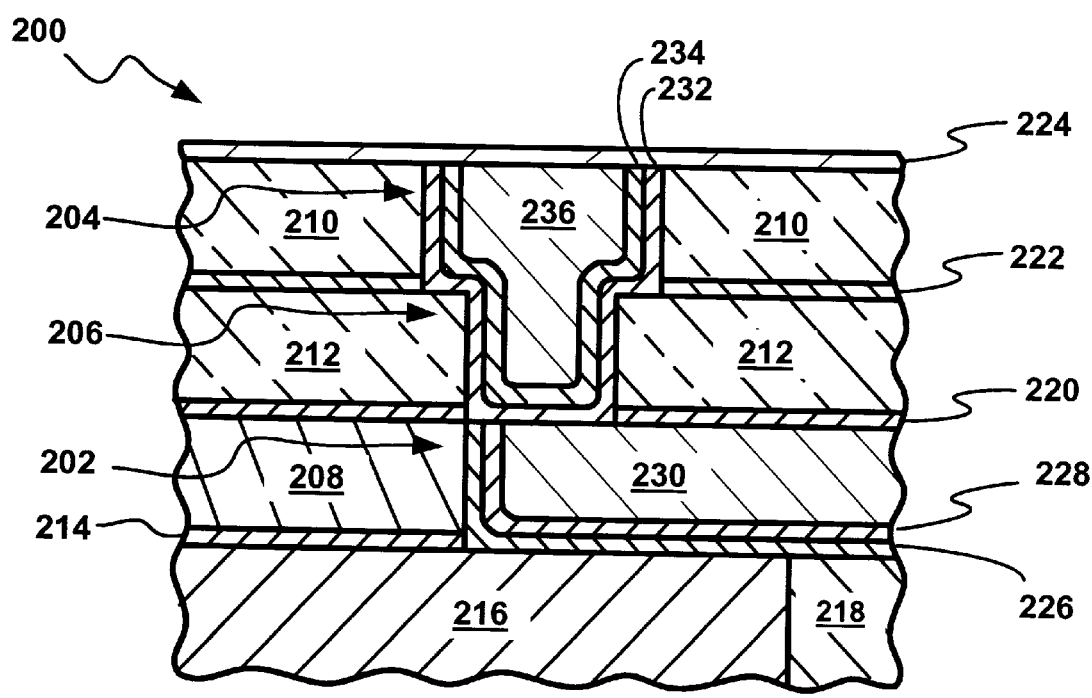
FIG. 3 is a cross-section of a semiconductor interconnect where the hillocks are suppressed in accordance with the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor contact 218 embedded in the device dielectric layer 216. The various layers above the device dielectric layer 216 are sequentially: the first channel stop layer 214, the first channel dielectric layer 208, a capping layer 220, the via dielectric layer 212, a second channel stop layer 222, the second channel dielectric layer 210, and a next capping layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device.

The seed layers 228 and 234 form electrodes on which the conductor material of the conductor cores 230 and 236 are deposited. The seed layers 228 and 234 are of substantially the same conductor material as the conductor cores 230 and 236 and become part of the respective conductor cores 230 and 236 after the deposition.

After analyzing the formation of the hillocks, it has been determined that the hillocks 140 are due to conductor material grain growth resulting from the high temperatures used.

In the present invention, it has been discovered that it is possible to perform high temperature anneals at and above 400° C. of the semiconductor wafer 200 before each of the CMP steps which will stimulate the grain growth of conductor cores 230 and 236. The subsequent CMP steps will remove the conductor cores 230 and 236 and barrier layers 226 and 232 above their respective first and second dielectric layers 208 and 210.

As a result of the high temperature anneal before CMP, there will be no grain growth during passivation at high temperature and thus, hillocks will be suppressed during the passivation deposition of the respective capping layers 220 and 224. It has been found that the passivation temperature should always be lower than the anneal temperature to achieve the benefits of the present invention.

As shown in FIG. 3, the semiconductor wafer 200 has suppressed the hillocks 140 from being formed as in FIG. 2 (PRIOR ART).

In various embodiments, the barrier layers are of materials such as tantalum (Ta), titanium (Ti), tungsten (W), nitrides thereof, and combinations thereof. The seed layers are of materials such as copper (Cu), gold (Au), silver (Ag), alloys thereof and combinations thereof. The conductor cores with or without seed layers are of materials such as copper, aluminum (Al), gold, silver, alloys thereof, and combinations thereof. The dielectric layers are of dielectric materials such as silicon oxide ($SiO_x$), borophosphosilicate (BPSG) glass, etc. or low dielectric materials such as hydrogen silsesquioxane (HSQ), benzocyclobutene (BCB), etc. with dielectric constants below 3.0. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:

providing a semiconductor substrate having a semiconductor device provided thereon;

forming a dielectric layer on the semiconductor substrate;

forming a opening in the dielectric layer;

depositing a barrier layer to line the opening;

depositing a conductor core over the barrier layer to fill the opening and connect to the semiconductor device;

annealing the conductor core at a first temperature;

planarizing the conductor core and the barrier layer to be co-planar with the dielectric layer; and depositing a capping layer at a second temperature lower than the first temperature.

2. The method of manufacturing an integrated circuit as claimed in claim 1 wherein annealing the conductor core is performed with the first temperature at and above 400° C.

3. The method of manufacturing an integrated circuit as claimed in claim 1 wherein depositing the capping layer deposits the capping layer with the second temperature 400° C.

4. The method of manufacturing an integrated circuit as claimed in claim 1 wherein depositing the capping layer deposits silicon nitride.

5. The method of manufacturing an integrated circuit as claimed in claim 1 wherein depositing the conductor core deposits a material selected from a group consisting of copper, aluminum, gold, silver, an alloy thereof, and a combination thereof.

6. A method of manufacturing an integrated circuit comprising:

providing a silicon substrate having a semiconductor device provided thereon;

forming a device oxide layer on the semiconductor substrate;

forming a channel oxide layer;

forming a channel opening in the channel oxide layer;

depositing a barrier layer to line the channel opening;

depositing a seed layer to line the barrier layer;

depositing a conductor core to fill the channel opening and connect to the semiconductor device;

annealing the conductor core at a first temperature;

planarizing the conductor core, the seed layer, and the barrier layer by chemical mechanical polishing to be co-planar with the channel oxide layer; and depositing a capping layer by chemical vapor deposition at a second temperature below the first temperature.

7. The method of manufacturing an integrated circuit as claimed in claim 6 wherein annealing the conductor core is performed with the first temperature at and above 400° C.

8. The method of manufacturing an integrated circuit as claimed in claim 6 wherein depositing the capping layer deposits the capping layer with the second temperature below 400° C.

9. The method of manufacturing an integrated circuit as claimed in claim 6 wherein depositing the capping layer deposits silicon nitride.

10. The method of manufacturing an integrated circuit as claimed in claim 6 wherein depositing the seed layer and conductor core deposit materials selected from a group consisting of copper, gold, silver, an alloy thereof, and a combination thereof.

* * * * *